(12) United States Patent
Leigh et al.

(10) Patent No.: US 10,721,843 B2
(45) Date of Patent: Jul. 21, 2020

(54) COOLING VIA A SLEEVE CONNECTOR

(71) Applicant: Hewlett Packard Enterprise Development LP, Houston, TX (US)

(72) Inventors: Kevin Leigh, Houston, TX (US); George Megason, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 78 days.

(21) Appl. No.: 15/565,945

(22) PCT Filed: Apr. 30, 2015

(86) PCT No.: PCT/US2015/028522
§ 371 (c)(1),
(2) Date: Oct. 12, 2017

(87) PCT Pub. No.: WO2016/175834
PCT Pub. Date: Nov. 3, 2016

(65) Prior Publication Data
US 2018/0054922 A1    Feb. 22, 2018

(51) Int. Cl.
H05K 7/20         (2006.01)
H05K 7/14         (2006.01)
H04B 10/40        (2013.01)

(52) U.S. Cl.
CPC ....... *H05K 7/20727* (2013.01); *H05K 7/1445* (2013.01); *H05K 7/1487* (2013.01);
(Continued)

(58) Field of Classification Search
CPC .... G06F 1/181–1/182; H05K 7/20218–20381; H05K 7/20409–20418;
(Continued)

(56) References Cited

U.S. PATENT DOCUMENTS 5,907,473 A * 5/1999 Przilas ............... H05K 7/20345
361/699
6,704,196 B1   3/2004 Rodriguez et al.
(Continued)

FOREIGN PATENT DOCUMENTS

JP    H07183676    7/1995
JP    2002217577   8/2002

OTHER PUBLICATIONS

International Search Report and Written Opinion received for PCT Patent Application No. PCT/US2015/028522, dated Jan. 28, 2016, 10 pages.
(Continued)

*Primary Examiner* — Jayprakash N Gandhi
*Assistant Examiner* — Razmeen Gafur
(74) *Attorney, Agent, or Firm* — Dicke, Billig, Czaja, PLLC

(57) ABSTRACT

One example of a system includes a blade enclosure and a midplane within the blade enclosure. The midplane supports a first sleeve connector and a second sleeve connector, where each of the first and second sleeve connectors have a first side and a second side. A server blade installed in the blade enclosure includes an air duct coupled to the first side of the first sleeve connector. A cooling module including an air manifold is coupled to the second side of the first sleeve connector to deliver cool air to the air duct of the server blade.

8 Claims, 13 Drawing Sheets

(52) U.S. Cl.
CPC ......... *H05K 7/20836* (2013.01); *H04B 10/40* (2013.01); *H05K 7/20145* (2013.01); *H05K 7/20172* (2013.01)

(58) Field of Classification Search
CPC ... H05K 7/20009–202; H05K 7/20727; H05K 7/1445; H05K 7/1487; H05K 7/20836; H05K 7/20145; H05K 7/20172; H01L 23/367–3677; H01L 23/473; H01L 23/46–467; H04B 10/40
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,927,975 | B2* | 8/2005 | Crippen | G06F 1/183 312/223.1 |
| 7,016,194 | B1* | 3/2006 | Wong | G06F 1/20 361/679.02 |
| 7,061,760 | B2* | 6/2006 | Hornung | H05K 7/20154 165/104.33 |
| 7,280,356 | B2 | 10/2007 | Pfahnl | |
| 7,403,388 | B2 | 7/2008 | Chang | |
| 7,447,022 | B2* | 11/2008 | Murakami | H05K 7/206 165/104.34 |
| 7,539,020 | B2* | 5/2009 | Chow | H05K 7/20727 165/104.21 |
| 7,813,120 | B2* | 10/2010 | Vinson | H05K 7/20736 312/236 |
| 8,064,200 | B1* | 11/2011 | West | H05K 7/20563 361/694 |
| 8,238,094 | B1* | 8/2012 | Aybay | H05K 7/20563 312/236 |
| 8,390,998 | B2 | 3/2013 | Kliewer | |
| 8,405,985 | B1* | 3/2013 | Reynov | H05K 7/20736 361/688 |
| 8,854,814 | B2 | 10/2014 | Liu | |
| 8,908,372 | B1* | 12/2014 | West | H05K 7/20563 361/694 |
| 2002/0179286 | A1* | 12/2002 | Sterner | F28D 15/02 165/80.3 |
| 2003/0141089 | A1 | 7/2003 | Gravell et al. | |
| 2005/0207134 | A1* | 9/2005 | Belady | H05K 1/14 361/796 |
| 2007/0230118 | A1* | 10/2007 | Leija | H05K 7/20718 361/690 |
| 2008/0043405 | A1* | 2/2008 | Lee | G06F 1/185 361/600 |
| 2008/0218949 | A1* | 9/2008 | Hughes | G11B 33/125 361/678 |
| 2008/0239649 | A1* | 10/2008 | Bradicich | G06F 1/183 361/725 |
| 2008/0316704 | A1* | 12/2008 | Vinson | G06F 1/20 361/695 |
| 2009/0251851 | A1* | 10/2009 | McGill, Sr. | H05K 7/186 361/623 |
| 2010/0002382 | A1* | 1/2010 | Aybay | H05K 7/20563 361/695 |
| 2010/0172092 | A1* | 7/2010 | Davis | H05K 7/20572 361/692 |
| 2010/0267324 | A1* | 10/2010 | Mutton | F24F 11/745 454/168 |
| 2011/0045759 | A1* | 2/2011 | Rasmussen | H05K 7/20572 454/184 |
| 2011/0182028 | A1 | 7/2011 | Tan et al. | |
| 2012/0081850 | A1* | 4/2012 | Regimbal | G06F 1/185 361/679.02 |
| 2012/0170191 | A1* | 7/2012 | Jensen | G06F 1/183 361/679.02 |
| 2013/0160984 | A1 | 6/2013 | Cash et al. | |
| 2013/0267161 | A1 | 10/2013 | Iqbal | |
| 2014/0071618 | A1 | 3/2014 | Tian et al. | |
| 2014/0073234 | A1* | 3/2014 | Elison | H05K 7/20727 454/184 |
| 2015/0003014 | A1* | 1/2015 | Agostini | H05K 7/20336 361/692 |
| 2015/0036287 | A1* | 2/2015 | Ross | H05K 7/20736 361/679.48 |
| 2015/0116929 | A1* | 4/2015 | Shabbir | H05K 7/20736 361/679.48 |
| 2015/0160702 | A1* | 6/2015 | Franz | G06F 1/20 361/679.47 |
| 2015/0264836 | A1* | 9/2015 | Ambriz | H05K 7/20181 361/679.46 |
| 2015/0334879 | A1* | 11/2015 | Fricker | H05K 7/20809 361/679.47 |
| 2016/0050796 | A1* | 2/2016 | Mayenburg | H05K 5/0213 361/679.48 |
| 2016/0095262 | A1* | 3/2016 | Ding | H05K 7/1445 361/679.49 |
| 2016/0183413 | A1* | 6/2016 | Roesner | G06F 1/20 361/679.48 |
| 2017/0311486 | A1* | 10/2017 | Milligan | H05K 7/20736 |

OTHER PUBLICATIONS

International Preliminary Report on Patentability received for PCT Patent Application No. PCT/US2015/028522, dated Nov. 9, 2017, 9 pages.
European Search Report and Search Opinion Received for EP Application No. 15890966.3, dated Sep. 27, 2018, 9 pages.

* cited by examiner

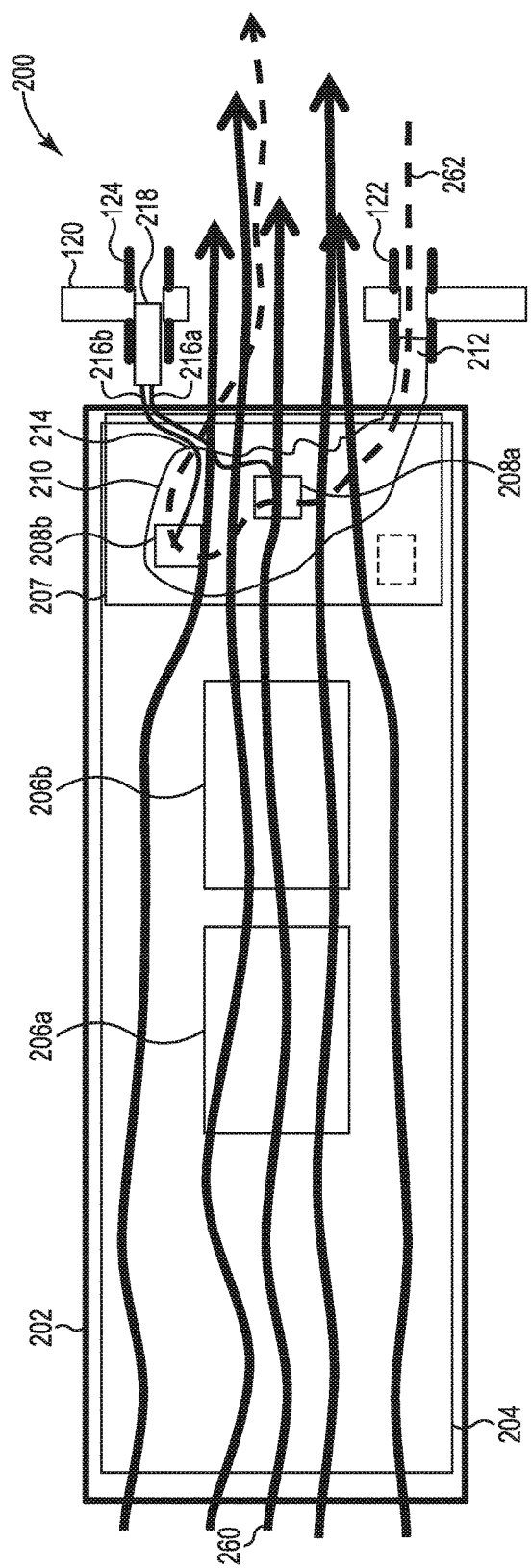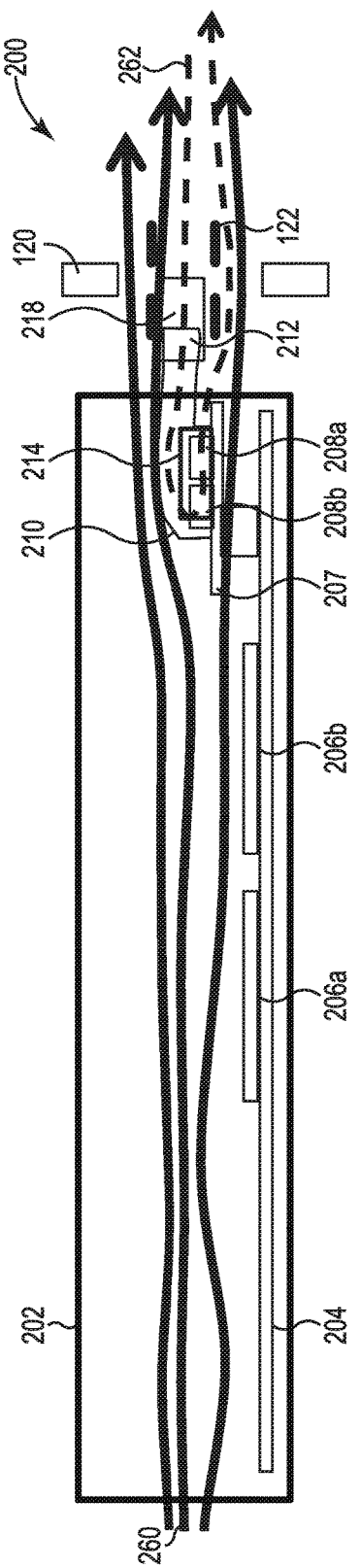
Fig. 3A
Fig. 3B

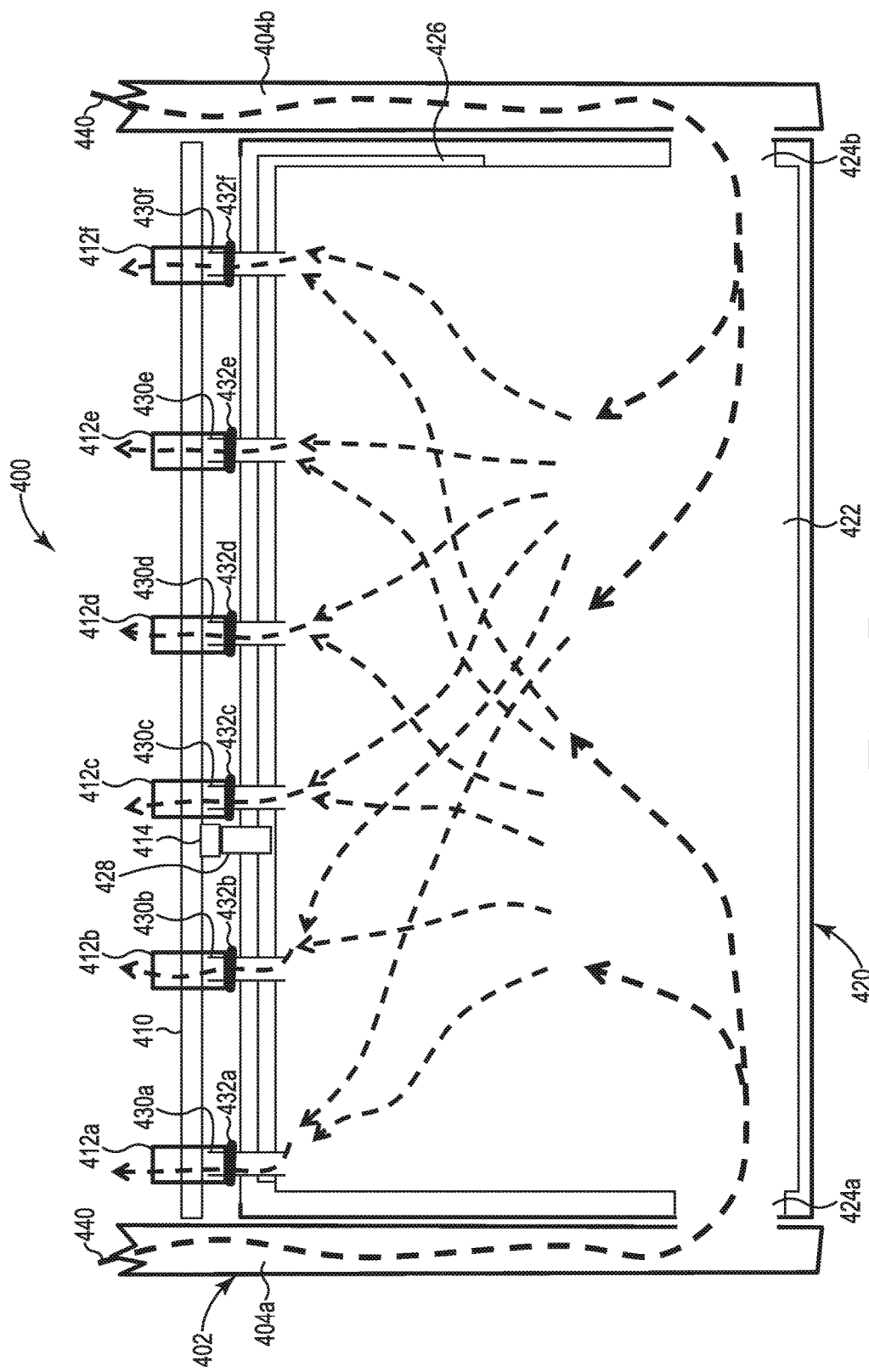

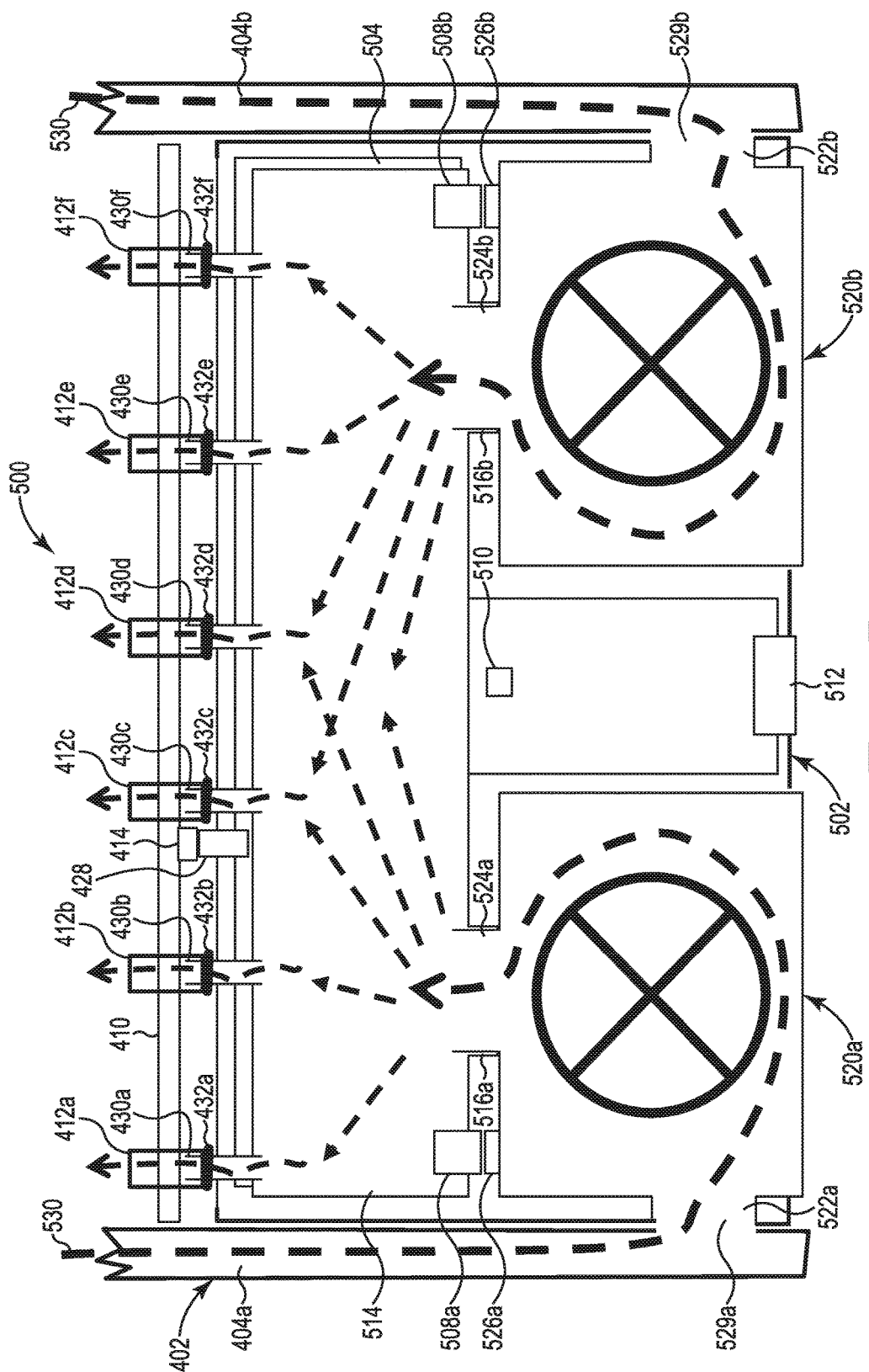

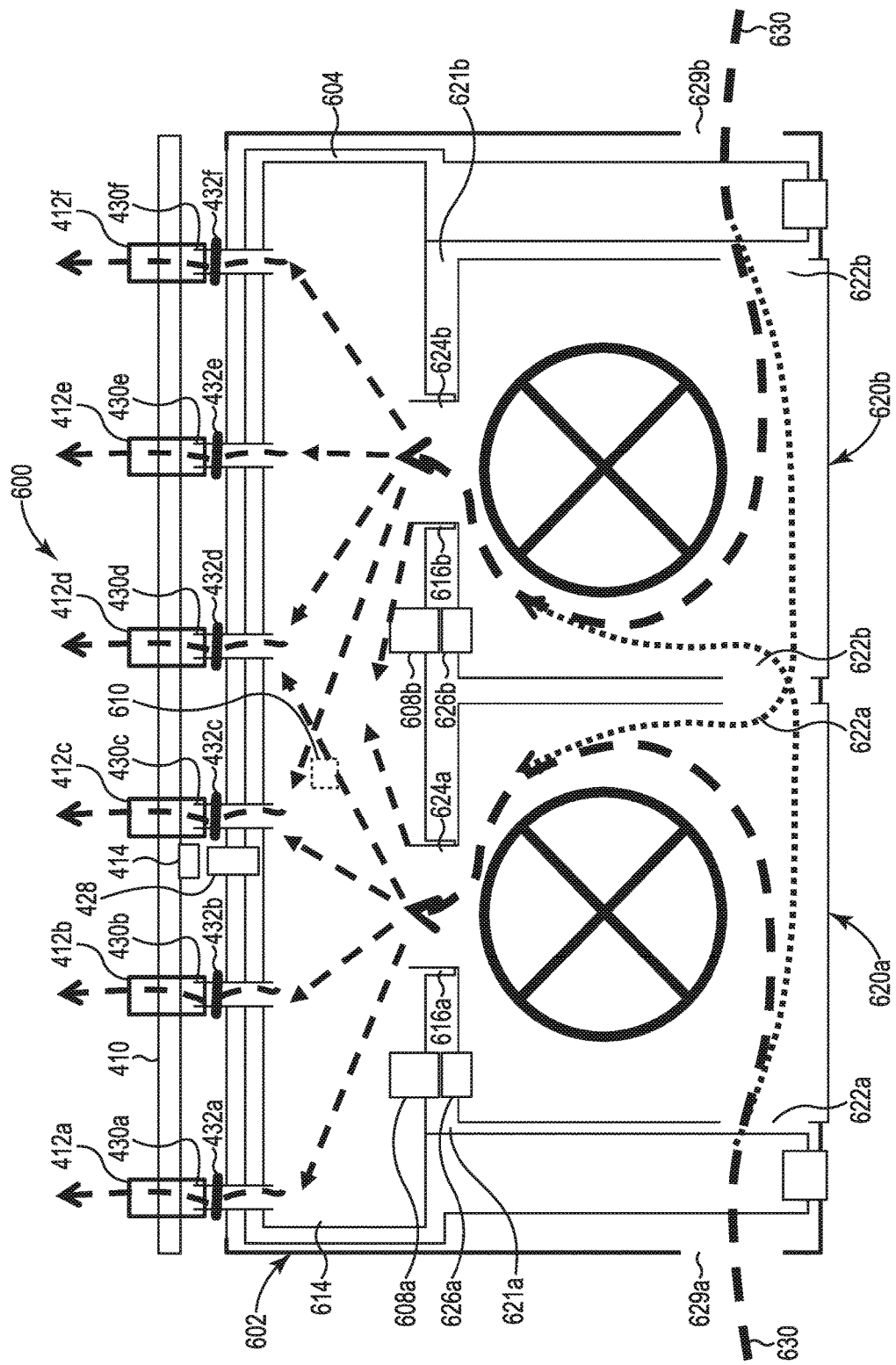

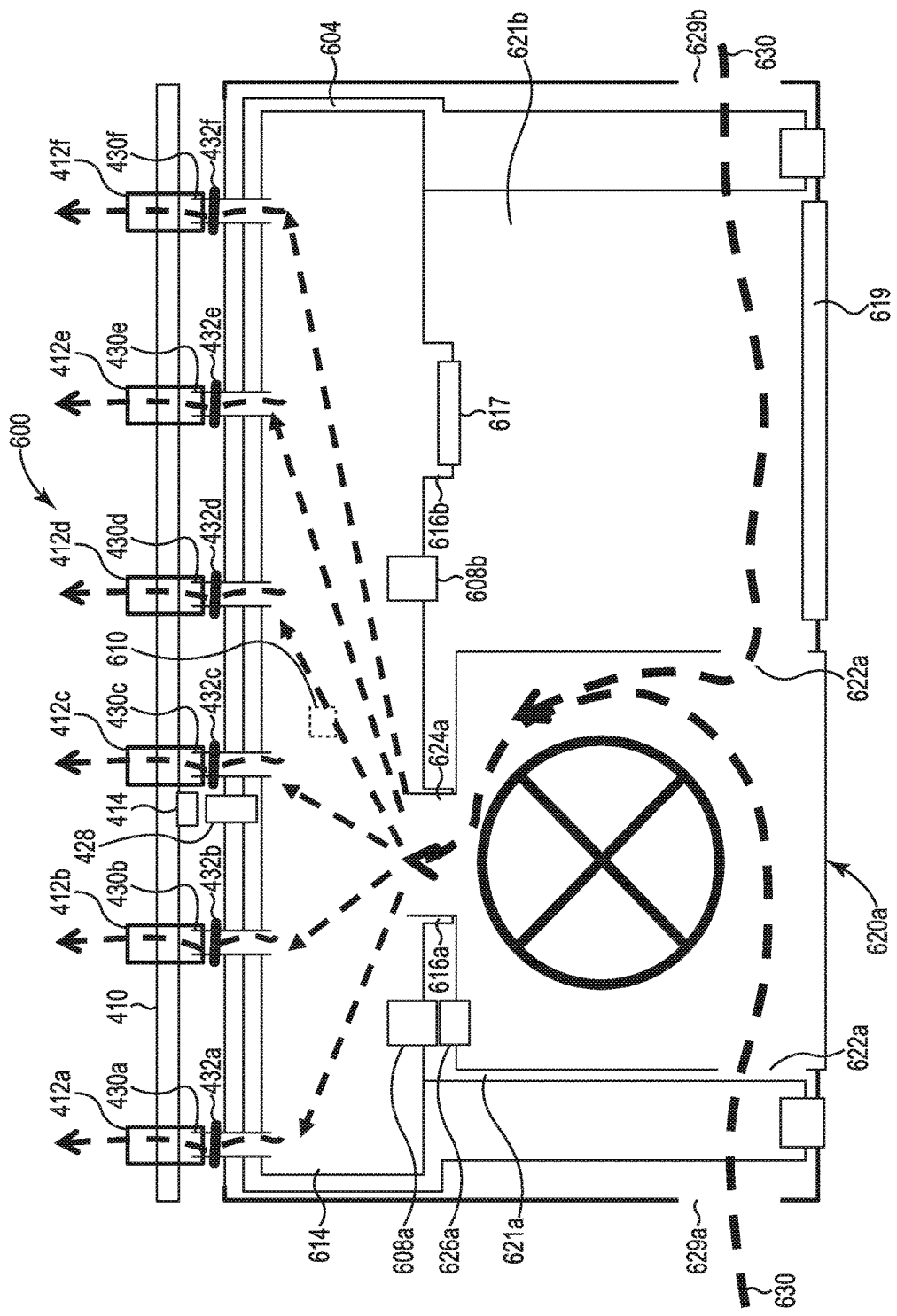

COOLING VIA A SLEEVE CONNECTOR

BACKGROUND

Blade enclosures provide the power, cooling, and I/O infrastructure to support modular server, interconnect, and storage components. Blade enclosure fans may pull cool air (e.g., 40° C.) from the front of server blades and exhaust hot air to the rear of the enclosure. Modern server blades have high-power processor and memory devices that may heat the incoming cool air to 70° C.

BRIEF DESCRIPTION OF THE DRAWINGS

FIGS. 3A and 3B illustrate a side view and a top view, respectively, of one example of a system including secondary reverse cooling.

FIGS. 5A and 5B illustrate top views of one example of a system including a cooling module.

FIGS. 6A-6C illustrate different views of another example of a system including a cooling module.

FIGS. 7A and 7B illustrate top views of another example of a system including a cooling module.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Components downstream to processors of server blades may be exposed to high temperatures. Temperature-sensitive components, such as optical transceivers, have a shorter lifetime when they operate in higher temperature ranges (e.g., 55° C.-70° C.). Accordingly, a server blade cooling system as disclosed herein uses sleeve connectors supported by a midplane of a blade enclosure to provide secondary cool air to components on a server blade in a reverse direction of the primary cool air flow path. In one example, the sleeve connectors may be redundant optical sleeve connectors that are not used for optical connections. In another example, the sleeve connectors may be dedicated for secondary cool air delivery. The secondary cool air may be provided to temperature-sensitive components of a server blade such as optical transceivers. By providing secondary cool air to temperature-sensitive components, the temperature-sensitive components may be employed on mezzanine cards, which enable optical links on server blades. Optical links may be more flexibly routed in datacenter rooms compared to electrical links.

Figure 1:
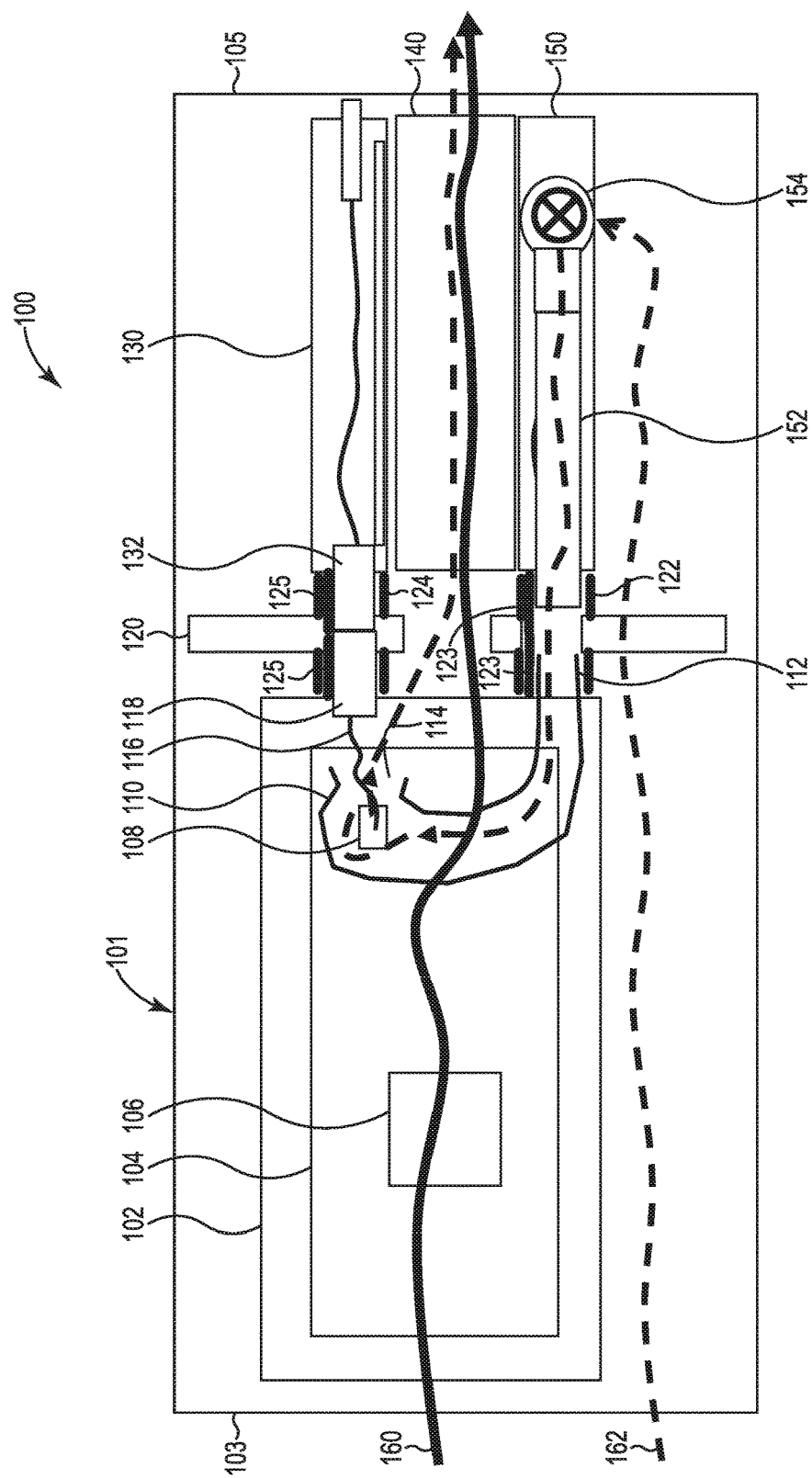
FIG. 1 illustrates a side view of one example of a blade enclosure system.

FIG. 1 illustrates a side view of one example of a blade enclosure system 100. Blade enclosure system 100 includes a blade enclosure 101 having a midplane 120, a server blade 102, a network module 130, enclosure fans 140, and a cooling module 150. Midplane 120 includes a first sleeve connector 122 and a second sleeve connector 124. Each sleeve connector 122 and 124 may include shutters 123 and 125, respectively, on each side of each sleeve connector. The shutters are closed when a component is not coupled to a corresponding side of the sleeve connector and open (as shown) when a component is coupled to a corresponding side of the sleeve connector.

Server blade 102 includes a motherboard 104 including a high-power component 106 (e.g., a processor) and a temperature-sensitive component 108 (e.g., an optical transceiver) electrically coupled to the motherboard. Server blade 102 also includes an air duct 110 within which temperature-sensitive component 108 is arranged. In one example, air duct 110 includes a thermally non-conductive material. With server blade 102 installed in the front 103 of blade enclosure 101, one side 112 of air duct 110 is coupled to a first side of sleeve connector 122 to receive cool air and the other side 114 of air duct 110 is open to exhaust hot air. In one example, side 112 of air duct 110 blindmates to sleeve connector 122. Optical transceiver 108 is optically coupled to an optical connector 118 through an optical cable 116. Optical connector 118 is coupled to a first side of sleeve connector 124. In one example, optical connector 118 blindmates to sleeve connector 124.

Network module 130 includes an optical connector 132. With network module 130 installed in the rear 105 of blade enclosure 101, optical connector 132 is coupled to a second side of sleeve connector 124. In one example, optical connector 132 blindmates to sleeve connector 124. Enclosure fans 140 are installed in the rear 105 of blade enclosure 101. Cooling module 150 includes an air manifold 152. In one example, cooling module 150 includes a fan 154 mechanically coupled to air manifold 152 to deliver cool air to the air manifold. With cooling module 150 installed in the rear 105 of blade enclosure 101, air manifold 152 is coupled to a second side of sleeve connector 122. In one example, air manifold 152 blindmates to sleeve connector 122.

In operation, enclosure fans 140 in the rear 105 of blade enclosure 101 provide a primary air flow path 160 which draws cool air into server blade 102 from the front 103 of the enclosure and exhausts hot air to the rear 105 of the enclosure. Primary air flow path 160 cools high-power component 106 as well as other components (not shown) of server blade 102. Cooling module 150 provides a secondary air flow path 162 by drawing cool air into blade enclosure 101 from the front 103 of the enclosure through enclosure side-channels (not shown) and providing the cool air to air duct 110 through air manifold 152 and sleeve connector 122. The secondary air flow path 162 cools temperature-sensitive component 108 within air duct 110. The hot air within air duct 110, after cooling the temperature-sensitive component 108, is exhausted to merge with the primary air flow path 160.

While FIG. 1 illustrates a blade enclosure 101 with one server blade 102, one network module 130, one cooling module 150, and two sleeve connectors 122 and 124, in other examples, blade enclosure 101 may include any suitable number of server blades, network modules, cooling modules, and corresponding sleeve connectors.

Figure 2A:
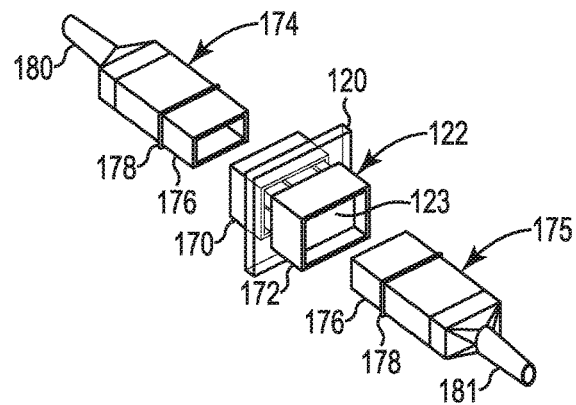
FIGS. 2A-2C illustrate different views of one example of a sleeve connector and air connectors.
Figure 2B:
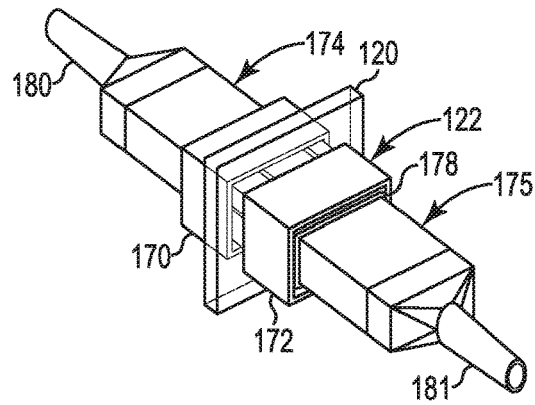
Figure 2C:
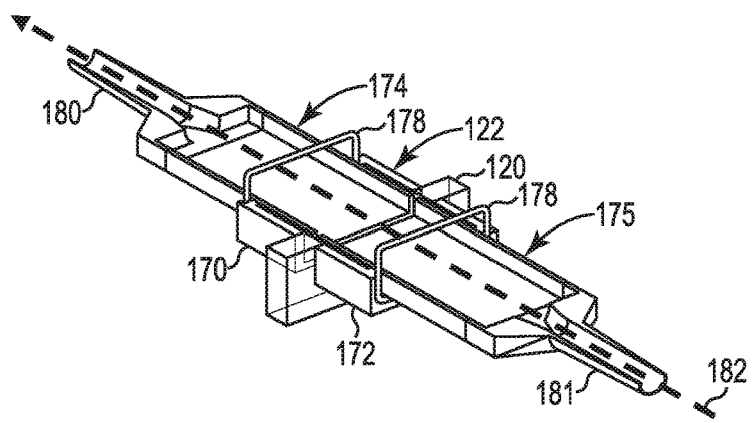

FIGS. 2A-2C illustrate different views of one example of sleeve connector 122 and air connectors 174 and 175. FIG. 2A illustrates air connectors 174 and 175 uninstalled from sleeve connector 122, where the shutters 123 on each side of sleeve connector 122 are closed. FIG. 2B illustrates air connectors 174 and 175 installed in sleeve connector 122, where the shutters 123 (not visible) on each side of sleeve connector 122 are open towards the inner cavities of each side of sleeve connector 122. FIG. 2C illustrates a secondary cool air flow path 182 through cross-sectional views of air connectors 174 and 175 and sleeve connector 122.

Sleeve connector 122 is supported by midplane 120 and includes a first side 170 and a second side 172. First side 170 may be coupled to a first air connector 174, and second side 172 may be coupled to a second air connector 175. Each air connector 174 and 175 includes a connector housing 176 for coupling to sleeve connector 122. Each air connector 174 and 175 also includes a gasket 178 to seal the connection between each air connector 174 and 175 and sleeve connector 122 to prevent air from leaking out of sleeve connector 122 when the air connectors are coupled to the sleeve connector. Connector housing 176 of air connector 174 may transition to an air duct interface 180, and connector housing 176 of air connector 175 may transition to a cooling module interface 181. As illustrated in FIG. 2C, the air flow path 182 passes through cooling module interface 181 of air connector 175, through the second side 172 and then the first side 170 of sleeve connector 122, through air connector 174 and then through air duct interface 180.

FIGS. 3A and 3B illustrate a side view and a top view, respectively, of one example of a system 200 including secondary reverse cooling. System 200 includes a midplane 120 and a server blade 202. The blade enclosure and other components (e.g., network modules, enclosure fans, and cooling modules) of system 200 have been excluded from FIGS. 3A and 3B for simplicity. Midplane 120 includes first sleeve connector 122 and second sleeve connector 124 as previously described and illustrated with reference to FIG. 1.

Server blade 202 includes a motherboard 204 including high-power components (e.g., processors) 206a and 206b and a mezzanine card 207 including temperature-sensitive components 208a and 208b (e.g., optical transceivers). Mezzanine card 207 also includes an air duct 210 within which temperature-sensitive components 208a and 208b are arranged. With server blade 202 installed in a blade enclosure, one side 212 of air duct 210 is coupled to a first side of sleeve connector 122 to receive cool air and the other side 214 of air duct 210 is open to exhaust secondary hot air. Optical transceivers 208a and 208b are optically coupled to an optical connector 218 through optical cables 216a and 216b, respectively. Optical connector 218 is coupled to a first side of sleeve connector 124.

In operation, enclosure fans (not shown) in the rear of a blade enclosure provide a primary air flow path 260 which draws cool air into the server blade 202 from the front of the blade enclosure and exhausts hot air to the rear of the enclosure. Primary air flow path 260 cools high-power components 206a and 206b as well as other components (not shown) of server blade 202. A cooling module (not shown) provides a secondary air flow path 262 which draws cool air into the blade enclosure and provides the cool air to air duct 210 through sleeve connector 122. The secondary air flow path 262 cools temperature-sensitive components 208a and 208b within air duct 210. The secondary hot air within air duct 210, after cooling the temperature-sensitive components 208a and 208b, is exhausted into the primary air flow path 260.

Figure 4:
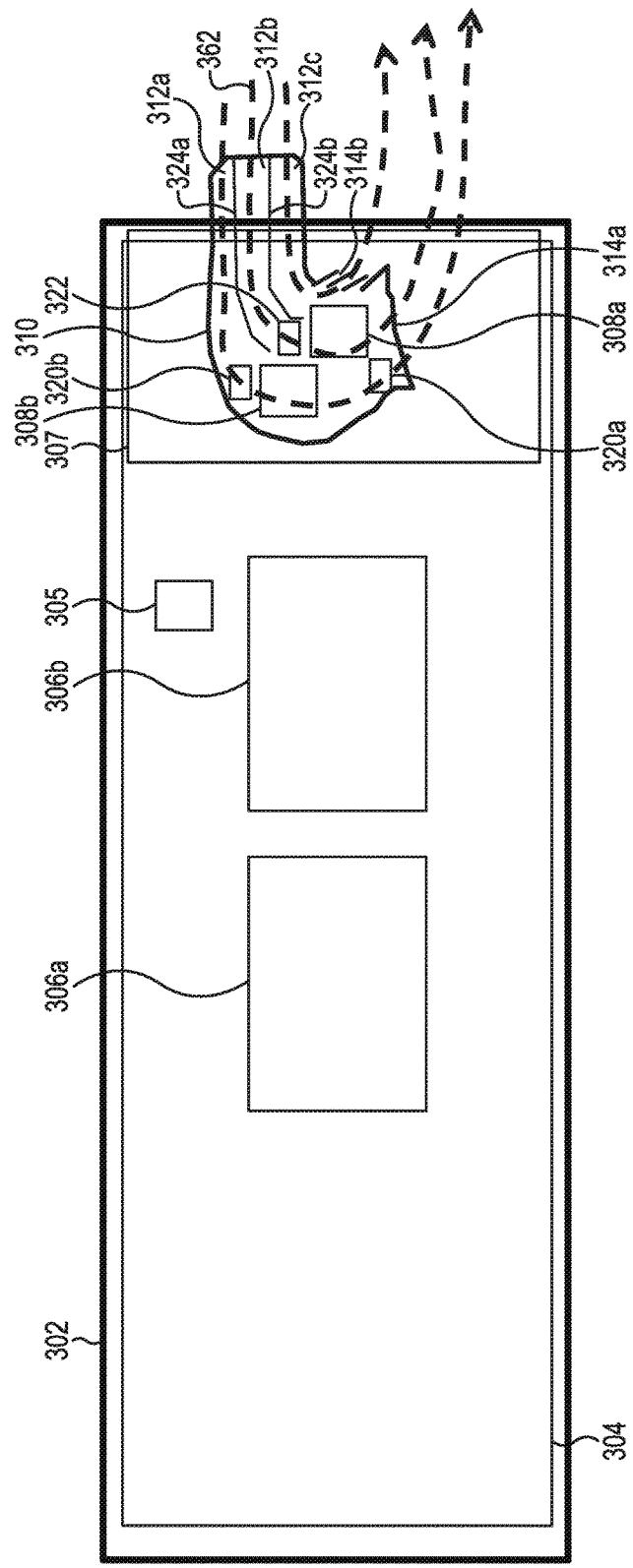
FIG. 4 illustrates a side view of one example of a server blade.

FIG. 4 illustrates a side view of one example of a server blade 302. Server blade 302 includes a motherboard 304 including high-power components 306a and 306b (e.g., processors), a sever management controller 305, and a mezzanine card 307. Mezzanine card 307 includes temperature-sensitive components 308a and 308b (e.g., optical transceivers), temperature sensors 320a and 320b, and an air flow sensor 322. Mezzanine card 307 also includes an air duct 310 within which temperature-sensitive components 308a and 308b, temperature sensors 320a and 320b, and air flow sensor 322 are arranged.

Air duct 310 may include interior dividing walls 324a and 324b to direct a secondary air flow 362 to multiple temperature-sensitive components 308a and 308b within the air duct. In addition, air duct 310 may include multiple air vents 314a and 314b for the secondary hot air to be exhausted. Air flow sensor 322 may measure the incoming secondary air flow delivered from a cooling module. Temperature sensors 320a and 320b may measure how much the secondary cool air is heated. Air flow sensor 322 and temperature sensors 320a and 320b may communicate with server management controller 305, which in turn may communicate with an enclosure manager (not shown). The enclosure manager may communicate with a cooling module controller, thereby enabling the cooling module controller to collect the secondary air flow rate and secondary hot air temperature information. The secondary air flow rate and secondary hot air temperature information may be used by the cooling module controller to adjust the secondary cool air delivered to server blade 302 by a cooling module.

Figure 5A:
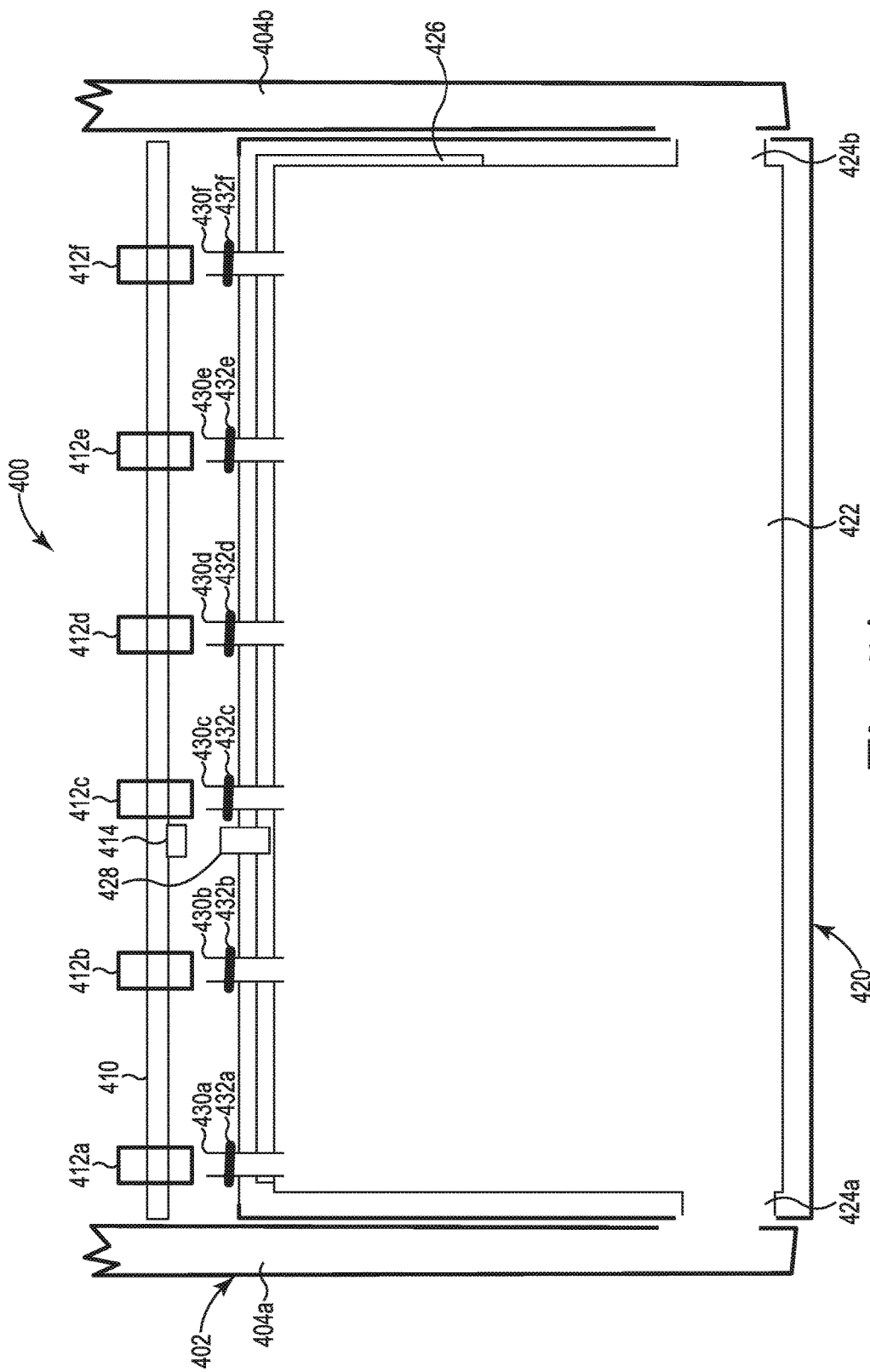

FIG. 5A illustrates a top view of one example of a system 400 with an uninstalled cooling module 420 and FIG. 5B illustrates a top view of one example of system 400 with cooling module 420 installed. System 400 includes a blade enclosure 402 having side channels 404a and 404b and a midplane 410. Midplane 410 supports a plurality of sleeve connectors 412a-412f and a midplane power and management signal connector 414.

Cooling module 420 includes cool air intake ports 424a and 424b, an air manifold 422, a controller board 426, a cooling module power and management signal connector 428 electrically coupled to the controller board, and a plurality of air connectors 430a-430f. Each air connector 430a-430f includes an air connector gasket 432a-432f, respectively, Cool air intake ports 424a and 424b deliver cool air to air manifold 422, which delivers cool air to air connectors 430a-430f.

With cooling module 420 installed in blade enclosure 402 as illustrated in FIG. 5B, each air connector 430a-430f is coupled to one side of each sleeve connector 412a-412f, respectively. In addition, cooling module power and management signal connector 428 is communicatively coupled to midplane power and management signal connector 414. In this example, cooling module 420 is a passive cooling module (i.e., does not include fans) in which negative pressure in server blades (not shown) coupled to the other side of sleeve connectors 412a-412f causes air from air manifold 422 to be drawn out through the corresponding air connectors 412a-412f. In turn, secondary cool air is pulled from enclosure side channels 404a and 404b via cool air intake ports 424a and 424b, respectively, as indicated at 440. Air manifold 422 may include air baffles (not shown) for secondary air 440 to be evenly distributed to air connectors 412a-412f.

Figure 6A:
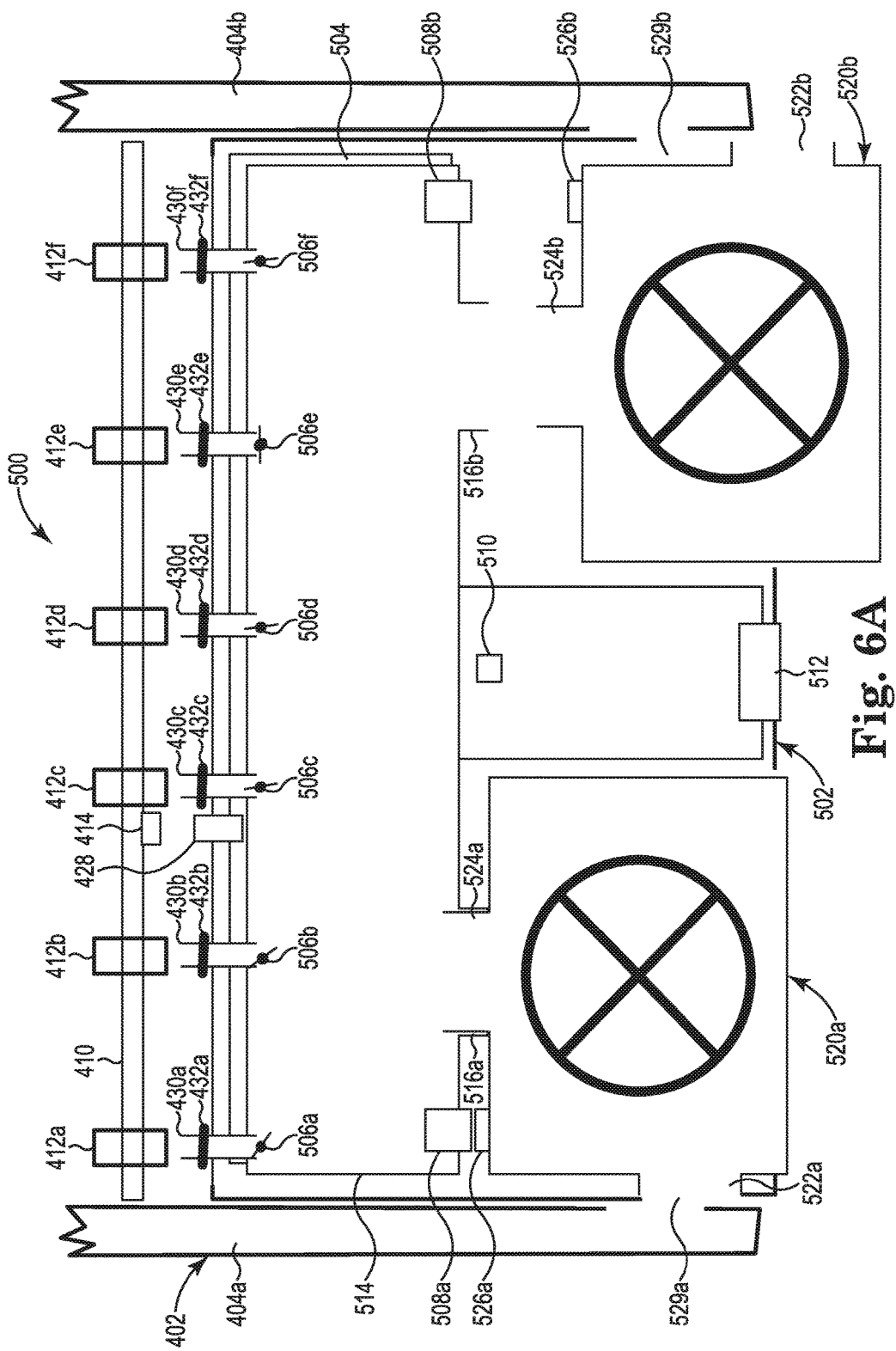
Figure 6C:
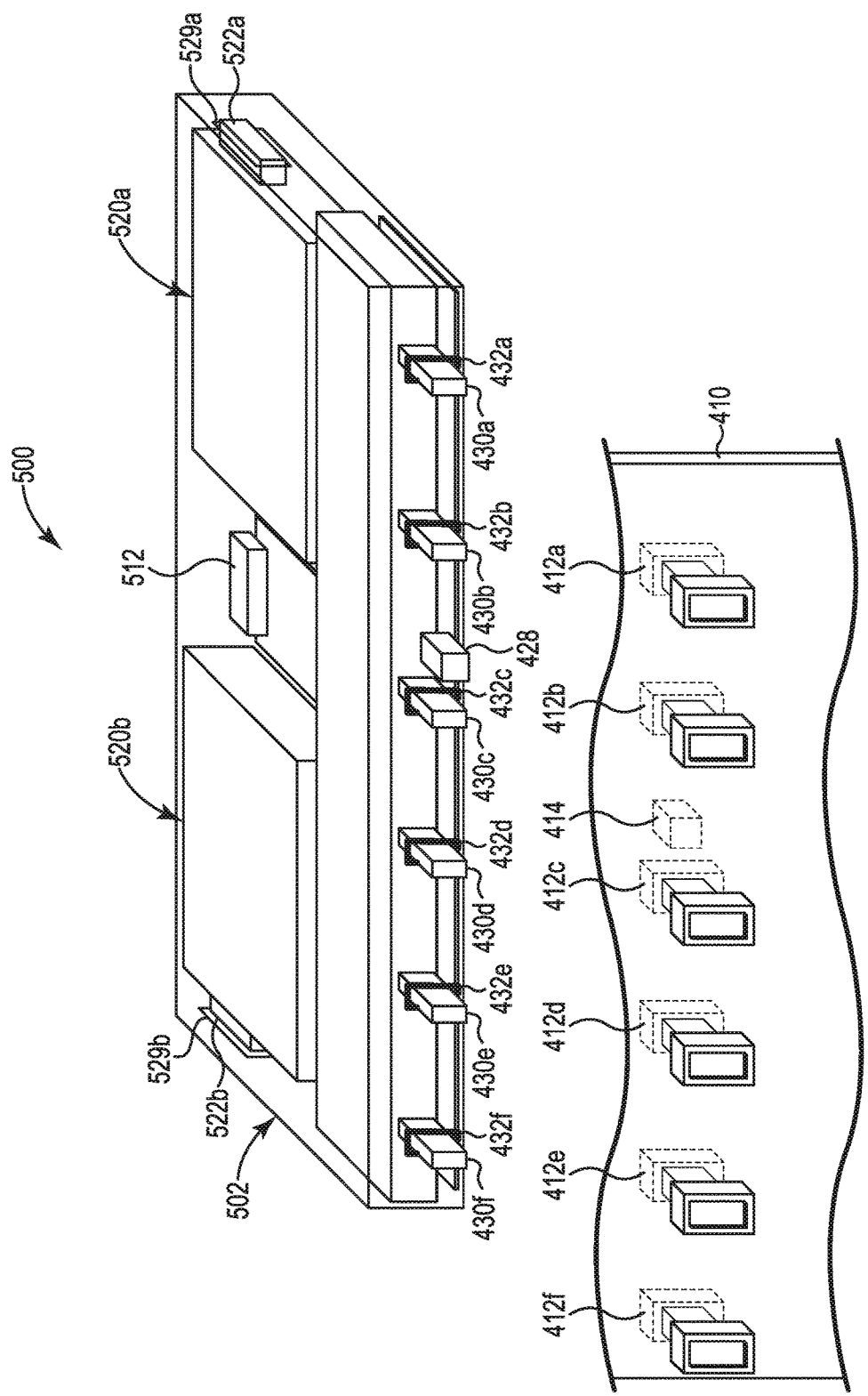

FIGS. 6A-6C illustrate different views of another example of a system 500 including a cooling module 502. FIG. 6A illustrates a top view of system 500 with an uninstalled cooling module 502 in which cooling module 502 includes an uninstalled fan 520*b*. FIG. 6B illustrates a top view of system 500 with an installed cooling module 502, FIG. 6C illustrates a perspective view of system 500 with an uninstalled cooling module 500.

As illustrated in FIG. 6A, system 500 includes a blade enclosure 402 having side channels 404*a* and 404*b* and a midplane 410. Midplane 410 supports a plurality of sleeve connectors 412*a*-412*f* and a midplane power and management signal connector 414. Cooling module 502 includes a controller board 504, a cooling module power and management signal connector 428 electrically coupled to the controller board, a first fan power and management signal connector 508*a* electrically coupled to the controller board, a second fan power and management signal connector 508*b* electrically coupled to the controller board, a cooling module controller 510 electrically coupled to the controller board, and status displays 512 electrically coupled to the controller board. Cooling module 502 also includes an air manifold 514, a plurality of air flow regulators 506*a*-506*f*, and a plurality of air connectors 430*a*-430*f*. Each air connector 430*a*-430*f* includes an air connector gasket 432*a*-432*f*, respectively. Cooling module 502 also includes a first removable fan 520*a* and a second removable fan 520*b*, which may provide a pair of redundant fans.

Each fan 520*a* and 520*b* includes a cool air intake port 522*a* and 522*b* and a cool air delivery port 524*a* and 524*b*, respectively. Each fan 520*a* and 520*b* also includes a fan power and management signal connector 526*a* and 526*b*, respectively. With fans 520*a* and 520*b* installed as illustrated in FIG. 6B, fan 520*b* is rotated 180° with respect to fan 520*a* such that both fans have their cool air intake ports 522*a* and 522*b* aligned with cool air intake ports 529*a* and 529*b*, respectively, of cooling module 502. The cool air delivery ports 524*a* and 524*b* of fans 520*a* and 520*b* are coupled to air manifold 514 via air manifold ports 516*a* and 516*b*, respectively. The fan power and management signal connectors 526*a* and 526*b* of fans 520*a* and 520*b* are communicatively coupled to fan power and management signal connectors 508*a* and 508*b*, respectively.

As illustrated in FIG. 6A, air manifold 514 may include air flow regulators 506*a*-506*f* for each air connector 430*a*-430*f* to individually control the flow of air to each air connector 430*a*-430*f*, respectively. Air manifold 514 may include baffles (not shown) to route air within air manifold 514, and air flow regulators 506*a*-506*f* may be positioned within corresponding air baffles, to control the air flows directed to the corresponding air connectors 430*a*-430*f*. Air flow regulators 506*a*-506*f* have been excluded from FIG. 6B for simplicity. Each air flow regulator 506*a*-506*f* may be controlled by cooling module controller 510. Cooling module controller 510 may also control fans 520*a* and 520*b* via fan power and management signal connectors 508*a* and 508*b* and fan power and management signal connectors 526*a* and 526*b*, respectively. Cooling module controller 510 may communicate with an enclosure manager (not shown) via cooling module power and management signal connector 428 and midplane power and management signal connector 414 of enclosure midplane 410. Cooling module controller 510 may communicate with server blades via the enclosure manager to collect secondary cool air flow rate and secondary hot air temperature information. The collected information may be used to adjust the secondary cool air delivered to each server blade by changing the speed of fan 520*a* and/or 520*b* and/or by adjusting the corresponding air flow regulators 506*a*-506*f*. Status displays 512 may display the operating conditions of components within cooling module 502.

With cooling module 502 installed in blade enclosure 402 as illustrated in FIG. 6B, each air connector 430*a*-430*f* is coupled to one side of each sleeve connector 412*a*-412*f*, respectively. In addition, cooling module power and management signal connector 428 is communicatively coupled to midplane power and management signal connector 414. In this example, cooling module 502 is an active cooling module in which fans 520*a* and 520*b* pull secondary cool air as indicated at 530 from enclosure side channels 404*a* and 404*b* via cool air intake ports 522*a* and 522*b*, respectively. Fans 520*a* and 520*b* deliver the secondary cool air to air manifold 514 via cool air delivery ports 524*a* and 524*b*, respectively, and out through the air connectors 430*a*-430*f*.

FIGS. 7A and 7B illustrate top views of another example of a system 600 including a cooling module 602. FIG. 7A illustrates cooling module 602 with two fans 620*a* and 620*b* installed and FIG. 7B illustrates cooling module 602 with one fan 620*a* installed. System 600 includes a blade enclosure (not shown) having a midplane 410. Midplane 410 supports a plurality of sleeve connectors 412*a*-412*f* and a midplane power and management signal connector 414.

Cooling module 602 includes a controller board 604, a cooling module power and management signal connector 428 electrically coupled to the controller board, a first fan power and management signal connector 608*a* electrically coupled to the controller board, a second fan power and management signal connector 608*b* electrically coupled to the controller board, and a cooling module controller 610 electrically coupled to the controller board. Cooling module 602 also includes an air manifold 614 and a plurality of air connectors 430*a*-430*f*. Each air connector 430*a*-430*f* includes an air connector gasket 432*a*-432*f*, respectively. Cooling module 602 may also include a first removable fan 620*a* and a second removable fan 620*b*, which may provide a pair of redundant fans. Fans 620*a* and 620*b* are installed in fan bays 621*a* and 621*b*, respectively, of cooling module 602.

Each fan 620*a* and 620*b* includes cool air intake ports 622*a* and 622*b* and a cool air delivery port 624*a* and 624*b*, respectively. Each fan 620*a* and 620*b* also includes a fan power and management signal connector 626*a* and 626*b*, respectively. With fans 620*a* and 620*b* installed, both fans have the same orientation since both fans pull air from both side of cooling module 602. The cool air intake ports 622*a* and 622*b* are aligned with cool air intake ports 629*a* and 629*b* of cooling module 602. The cool air delivery ports 624*a* and 624*b* of fans 620*a* and 620*b* are coupled to air manifold 614 via air manifold ports 616*a* and 616*b*, respectively. The fan power and management signal connectors 626*a* and 626*b* of fans 620*a* and 620*b* are communicatively coupled to fan power and management signal connectors 608*a* and 608*b* on controller board 604, respectively. When a fan is not installed as illustrated at air manifold port 616*b* in FIG. 7B, the air manifold port 616*b* is closed (e.g., by hinged doors) as indicated at 617, and the fan bay 621*b* is also closed (e.g., by hinged doors) as indicated at 619.

Cooling module controller 610 may control fans 620*a* and 620*b* via fan power and management signal connectors 608*a* and 608*b* and fan power and management signal connectors 626*a* and 626*b*, respectively. Cooling module controller 610 may also communicate with an enclosure manager (not shown) via cooling module power and management signal connector 428 and midplane power and management signal connector 414 of enclosure midplane 410. Cooling module controller 610 may communicate with server blades via the enclosure manager to collect secondary cool air flow rate and secondary hot air temperature information. The collected information may be used to adjust the secondary cool air delivered to each server blade by changing the speed of fan 620a and/or 620b. In other examples, cooling module 602 may also include air flow regulators for each air connector 432a-432f controlled by cooling module controller 610 as previously described and illustrated with reference to FIG. 6A.

With cooling module 602 installed in a blade enclosure, each air connector 430a-430f is coupled to one side of each sleeve connector 412a-412f, respectively. In addition, cooling module power and management signal connector 428 is communicatively coupled to midplane power and management signal connector 414. In this example, cooling module 602 is an active cooling module in which fans 620a and 620b pull secondary cool air as indicated at 630 from enclosure side channels via cool air intake ports 622a and/or 622b, respectively. As illustrated in FIG. 7A, fans 620a and 620b deliver the secondary cool air to air manifold 614 via cool air delivery ports 624a and/or 624b, respectively, and out through the air connectors 430a-430f. As illustrated in FIG. 7B, fan 620a delivers the secondary cool air to air manifold 614 via cool air delivery port 624a and out through the air connectors 430a-430f.

Figures 8A, 8B:
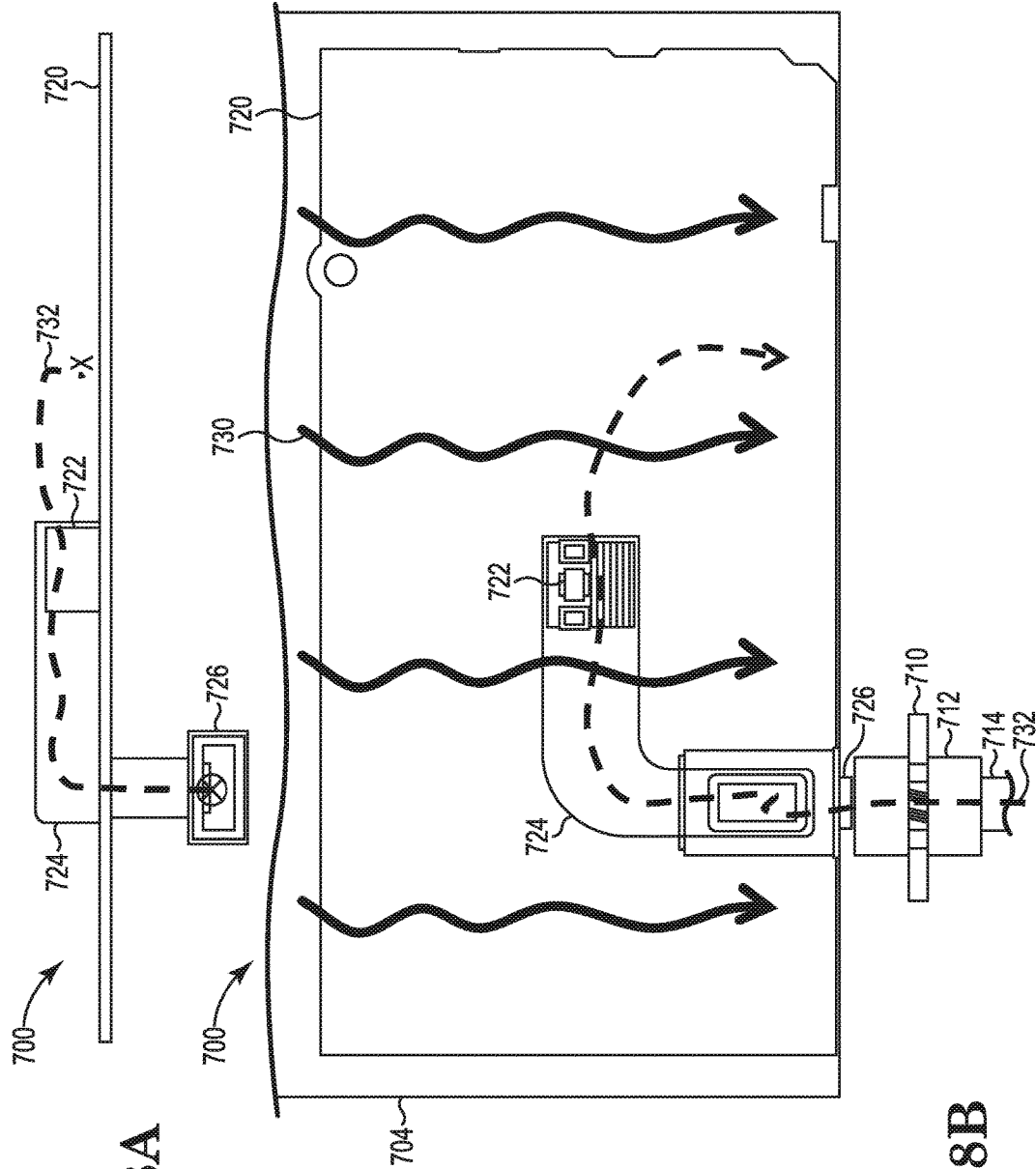
FIGS. 8A and 8B illustrate a rear view and a side view, respectively, of one example of a system including a mezzanine card.

FIGS. 8A and 8B illustrate a rear view and a side view, respectively, of one example of a system 700 including a mezzanine card 720. System 700 includes system board 704 of a server blade (not shown) including mezzanine card 720. System 700 also includes a blade enclosure midplane 710 supporting a sleeve connector 712.

Mezzanine card 720 includes an air duct 724 and a temperature-sensitive component 722 (e.g., an optical transceiver) arranged within air duct 724. In one example, a first portion of air duct 724 is arranged parallel to mezzanine card 720 and a second portion of air duct 724 is arranged through and perpendicular to mezzanine card 720. The second portion of air duct 724 terminates to an air connector 726, which may blindmate to one side of sleeve connector 712. The other side of sleeve connector 712 may be coupled to an air connector 714 of a cooling module (not shown). The primary air flow path is indicated at 730 and the secondary air flow path is indicated at 732. A portion of the secondary air flow path 732 is opposite to the primary air flow path 730. The secondary cool air passes over temperature-sensitive component 722 and the secondary hot air exhausts into the primary air flow path 730.

Figure 9:
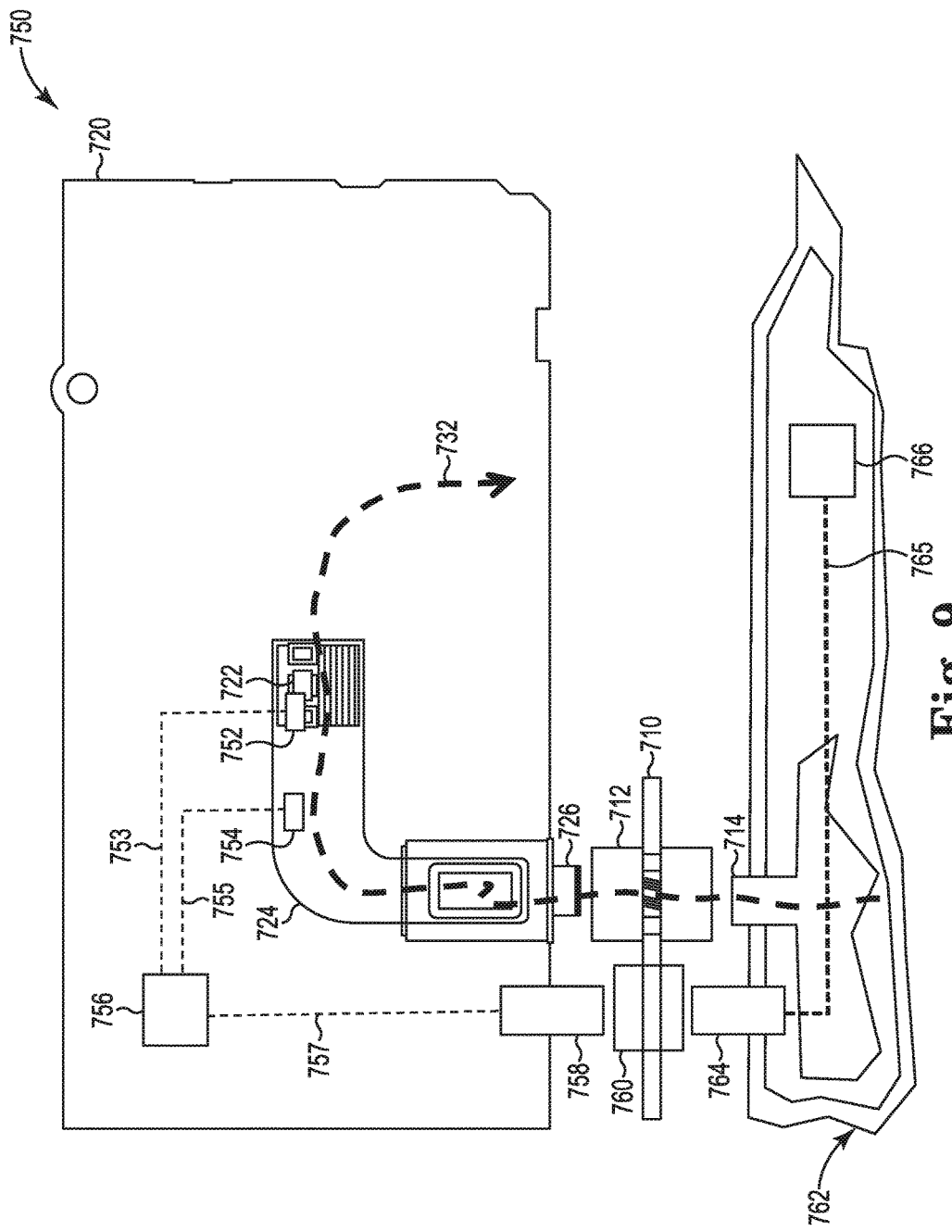
FIG. 9 illustrates another example of a system including a mezzanine card.

FIG. 9 illustrates another example of a system 750 including a mezzanine card 720. In this example, in addition to temperature-sensitive component 722, air duct 724, and air connector 726, mezzanine card 720 also includes sensors 752 and 754, a sensor controller 756, and a sensor signal connector 758. Sensors 752 and 754 are arranged within air duct 724 and may include air flow and/or temperature sensors. Sensor 752 is electrically coupled to sensor controller 756 through a signal path 753. Sensor 754 is electrically coupled to sensor controller 756 through a signal path 755. Sensor controller 756 is electrically coupled to sensor signal connector 758 through a signal path 757.

A cooling module 762 includes an air connector 714, a sensor signal connector 764, and a cooling module controller 766. Sensor signal connector 764 is electrically coupled to cooling module controller 766 through a signal path 765. With a server blade including mezzanine card 720 installed in a blade enclosure, sensor signal connector 758 is electrically coupled to sensor signal connector 764 via connector 760 of midplane 710. Cooling module 762 delivers secondary cool air as indicated by secondary air path 732 to temperature-sensitive component 722. Sensors 752 and 754 sense air flow and/or the temperature within air duct 724, and the air flow rate and/or temperature information is passed to cooling module controller 766 by sensor controller 756. Cooling module controller 766 may use the sensor data to adjust the secondary air flow delivered to temperature-sensitive component 722 by cooling module 762.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A system comprising:
    a blade enclosure;
    a midplane within the blade enclosure, the midplane supporting a first sleeve connector and a second sleeve connector, each of the first and second sleeve connectors having a first side and a second side;
    a server blade installed in the blade enclosure, the server blade comprising a primary heat-generating component that a primary air flow cools, an air duct coupled to the first side of the first sleeve connector, and a secondary heat-generating component that a secondary air flow cools, and; and
    a cooling module comprising an air manifold, the air manifold coupled to the second side of the first sleeve connector to deliver cool air of the secondary air flow to the air duct of the server blade,
    wherein upstream of the secondary heat-generating component, the secondary air flow is separate from and has a different direction than the primary air flow,
    and wherein downstream of the secondary heat-generating component, the secondary air flow merges with the primary air flow.

2. The system of claim 1, wherein the cooling module comprises a fan to deliver the cool air to the air manifold.

3. The system of claim 1, wherein the server blade comprises an optical transceiver within the air duct.

4. The system of claim 3, further comprising:
    a network module comprising a first optical connector coupled to the second side of the second sleeve connector,
    wherein the optical transceiver is optically coupled to a second optical connector, the second optical connector coupled to the first side of the second sleeve connector.

5. A server blade comprising:
    a motherboard;
    a first component electrically coupled to the motherboard to be cooled by a primary air flow path;
    an air duct to provide a secondary air flow path, the air duct to couple to a first side of a sleeve connector supported by a midplane of a blade enclosure with the server blade installed in the blade enclosure; and
    a second component within the air duct to be cooled by the secondary air flow path,
    wherein upstream of the second component, the secondary air flow path is separate from and has a different direction than the primary air flow path, and wherein downstream of the second component, the secondary air flow path merges with the primary air flow path.

6. The server blade of claim 5, wherein the air duct comprises a plurality of vents to exhaust hot air into the primary air flow path.

7. The server blade of claim 5, further comprising:
a temperature sensor within the air duct; and
an air flow sensor within the air duct,
wherein the temperature sensor and the air flow sensor provide, with the server blade installed in a blade enclosure, sensor data to a cooling module coupled to a second side of the sleeve connector.

8. The server blade of claim 5, further comprising:
a third component within the air duct, and
wherein the air duct comprises a dividing wall to provide a first secondary air flow path to the second component and a second secondary air flow path to the third component.

* * * * *